United States Patent
Wang et al.

(10) Patent No.: US 10,879,498 B2
(45) Date of Patent: Dec. 29, 2020

(54) OLED DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Lei Wang, Hubei (CN); Wenxu Xianyu, Hubei (CN); Wenliang Gong, Hubei (CN); Xiaowen Huang, Hubei (CN); Zesheng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/492,162

(22) PCT Filed: Apr. 8, 2019

(86) PCT No.: PCT/CN2019/081663
§ 371 (c)(1),
(2) Date: Sep. 9, 2019

(87) PCT Pub. No.: WO2020/172953
PCT Pub. Date: Sep. 3, 2020

(65) Prior Publication Data
US 2020/0274106 A1    Aug. 27, 2020

(51) Int. Cl.
*H01L 51/52*    (2006.01)
*H01L 27/32*    (2006.01)
(Continued)

(52) U.S. Cl.
CPC .......... *H01L 51/5284* (2013.01); *G06F 3/045* (2013.01); *H01L 27/322* (2013.01);
(Continued)

(58) Field of Classification Search
CPC . H01L 51/5284; H01L 51/0018; H01L 51/56; H01L 27/323; H01L 27/322;
(Continued)

(56) References Cited

U.S. PATENT DOCUMENTS

2004/0109101 A1* 6/2004 Kim ................ G02F 1/136209
                                                        349/44
2015/0049030 A1* 2/2015 Her .................... G06F 3/0412
                                                        345/173
(Continued)

*Primary Examiner* — Brent D Castiaux
(74) *Attorney, Agent, or Firm* — Mark M. Friedman

(57) ABSTRACT

An organic light emitting diode (OLED) display device includes an OLED display panel, a first insulating layer disposed on the OLED display panel, a first metal layer disposed on the first insulating layer, a second insulating layer disposed on the first metal layer and the first insulating layer, a second metal layer disposed on the second insulating layer, a black matrix disposed on the second metal layer, a hard mask disposed on the black matrix, and color resists disposed on the OLED display panel. The OLED display panel includes sub-pixels. Openings extend through the second metal layer, the black matrix, and the hard mask and are positioned corresponding to the sub-pixels. Each color resist is disposed in the openings. The present invention can effectively eliminate reflective light under strong light, and provide a manufacturing process implemented with a small number of masks at a lower product cost.

9 Claims, 14 Drawing Sheets

(51) Int. Cl.
  *H01L 51/56*   (2006.01)
  *H01L 51/00*   (2006.01)
  *G06F 3/045*   (2006.01)

(52) U.S. Cl.
  CPC ........ *H01L 27/323* (2013.01); *H01L 51/0018* (2013.01); *H01L 51/56* (2013.01); *G06F 2203/04103* (2013.01); *H01L 2251/56* (2013.01); *H01L 2251/566* (2013.01)

(58) Field of Classification Search
  CPC ........... H01L 2251/566; H01L 2251/56; H01L 27/3211; G06F 3/045; G06F 2203/04103
  See application file for complete search history.

(56) References Cited

U.S. PATENT DOCUMENTS

| | | | |
|---|---|---|---|
| 2016/0300889 A1* | 10/2016 | Kim | H01L 27/322 |
| 2016/0306241 A1* | 10/2016 | Choi | G02F 1/133504 |
| 2017/0194382 A1* | 7/2017 | Lee | H01L 51/5246 |
| 2017/0271429 A1* | 9/2017 | Kim | H01L 27/14647 |
| 2017/0345875 A1* | 11/2017 | Shim | H01L 51/5284 |
| 2018/0061910 A1* | 3/2018 | Cai | H01L 27/3223 |
| 2018/0182819 A1* | 6/2018 | Jo | G06F 3/0416 |

* cited by examiner

OLED DISPLAY DEVICE AND MANUFACTURING METHOD THEREOF

BACKGROUND OF INVENTION

1. Field of Invention

The present invention relates to a technical field of displays, and particularly to, an organic light emitting diode (OLED) display device and a manufacturing method thereof.

2. Related Art

Organic light emitting diodes (OLEDs) display devices have been regarded as the most potential development display devices due to advantages of being self-luminous, low driving voltages, high luminous efficiency, quick response times, high definition and contrast, nearly 180° wide viewing angles, and wide temperature range in use, and fulfilling flexible displays and large area and full-color displays.

OLEDs can be classified into two types: passive matrix OLEDs (PMOLEDs) and active matrix OLED (AMOLEDs). That is, a direct addressing type and a thin film transistor (TFT) matrix addressing type, wherein an AMOLED have pixels arranged in arrays, belonging to an active display type and having high luminous efficiency, generally used as high-definition large-sized display devices.

An OLED device generally include a substrate, an anode disposed on the substrate, a hole injection layer disposed on the anode, a hole transport layer disposed on the hole injection layer, a light emitting layer disposed on the hole transport layer, an electron transport layer on the light emitting layer, an electron injection layer and a cathode disposed on the electron transport layer. A principle of illumination of OLED devices is that semiconductor materials and organic luminescent materials are driven by electric fields, causing luminescence by carrier injection and recombination. Specifically, an OLED device generally uses an indium tin oxide (ITO) electrode and a metal electrode as an anode and a cathode of the device, respectively. Driven by a certain voltage, electrons and holes are injected from the cathode and the anode to the electron transport layer and the hole transport layer, respectively. The electrons and holes migrate to the light emitting layer through the electron transport layer and the hole transport layer, respectively, and meet in the light emitting layer to form excitons and excite the light emitting molecules, and the light emitting molecules emit visible light through radiation relaxation.

In order to reduce the reflectance under strong light, conventional OLED display devices each may be provided with a polarizer (POL) on a light emitting side of the OLED display panel. Such an anti-reflection method may lose light and reduce a lifespan of the OLED display device, resulting in a polarizer having a thick thickness and made of a brittle material, not beneficial to development of dynamic bending display panels. Another conventional OLED display device utilizes POL-less (no polarizer) technology to reduce reflectance. Specifically, polarizers are replaced with color filters. The color filters include color resists corresponding to sub-pixels of OLED display panels and black matrices (BM) disposed between adjacent color resists. Color filter layers each have a thickness of less than 5 microns (um), which is much less than a thickness (generally 100 um) of a polarizer and is beneficial for bending of OLED display devices. Besides, the color filter layers, compared to the polarizers, can increase light extraction rate from 42% to 60%, thereby extending a lifespan of the OLED display devices.

Please refer to FIG. 1 showing a current OLED display device using POL-less technology. The OLED display device includes an OLED display panel 100, a touch layer 200 disposed on the OLED display panel 100, a first protective (OC) layer 300 disposed on the touch layer 200, a color filter layer 400 disposed on the first protective layer 300, and a second protective layer 500 disposed on the color filter layer 400. The OLED display panel 100 includes a plurality of sub-pixels 110. The touch layer 200 includes a first insulating layer 210, a first metal layer 220 disposed on the first insulating layer 210, a second insulating layer 230 disposed on the first insulating layer 210 and the first metal layer 220, and a second metal layer 240 disposed on the second insulating layer 230. The second insulating layer 230 is provided with a via hole 231 located above the first metal layer 220, and the second metal layer 240 is in connection with the first metal layer 220 through the via hole 231. The second metal layer 240 is provided with a plurality of openings 241 located above the plurality of sub-pixels 110. The color filter layer 400 includes a plurality of color resists 410 each located above the plurality of sub-pixels 110, and a black matrix 420 located between the color resists 410. When the OLED display device is manufactured, the first metal layer 220, the second insulating layer 230, the second metal layer 240, and the black matrix 420 each need to be patterned by a mask. Therefore, number of photomasks required for the manufacturing process is large, resulting in high product cost.

SUMMARY OF INVENTION

An object of the present invention is to provide an organic light emitting diode (OLED) display device capable of reducing light reflectance and lowering product cost.

Another object of the present invention is to provide a method of manufacturing an OLED display device capable of reducing light reflectance and lowering product cost.

To achieve the above-mentioned objects, the present invention first provides an OLED display device, comprising an OLED display panel, a first insulating layer disposed on the OLED display panel, a first metal layer disposed on the first insulating layer, a second insulating layer disposed on the first metal layer and the first insulating layer, a second metal layer disposed on the second insulating layer, a black matrix disposed on the second metal layer, a hard mask disposed on the black matrix, and a plurality of color resists disposed on the OLED display panel; wherein the OLED display panel comprises a plurality of sub-pixels, and a plurality of openings extending through the second metal layer, the black matrix, and the hard mask and positioned corresponding to the plurality of sub-pixels, and wherein the plurality of color resists are disposed in the plurality of openings, respectively.

The plurality of color resists are disposed on the second insulating layer; or the second insulating layer is configured with a plurality of first holes disposed above the plurality of sub-pixels, the plurality of openings are disposed above the plurality of first holes, and the plurality of color resists are disposed on the first insulating layer and located in the plurality of first holes, respectively; or each of the second insulating layer and the first insulating layer is configured with a plurality of second holes disposed on the plurality of sub-pixels, the plurality of openings are disposed above the second holes, and the plurality of color resists are disposed on the OLED display panel and located in the plurality of second holes, respectively.

The OLED display device further comprises a protective film disposed on the hard mask and the plurality of color resists.

A material of the hard mask is silicon nitride, the first metal layer is transparent and has a structure comprising an aluminum layer sandwiched between two titanium layers, the second metal layer is transparent and has a structure comprising an aluminum layer sandwiched between two titanium layers, a material of each of the first insulating layer and the second insulating layer is silicon nitride, and the second insulating layer is configured with a via hole disposed on the first metal layer, wherein the second metal layer is in connection with the first metal layer through the via hole.

The present invention further provides a method of manufacturing an OLED display device, comprising step S1, providing an OLED display panel comprising a plurality of sub-pixels; step S2, forming a first insulating layer on the OLED display panel, forming a first metal layer on the first insulating layer, and forming a second insulating layer on the first metal layer and the first insulating layer; step S3, forming a metal material layer, a black matrix material layer, and a hard mask material layer in turn on the second insulating layer, and patterning the metal material layer, the black matrix material layer, and the hard mask material layer to form a second metal layer, a black matrix, and a hard mask in turn on the second insulating layer from bottom to top, wherein a plurality of openings are formed to extend through the second metal layer, the black matrix, and the hard mask and are disposed corresponding to the plurality of sub-pixels; and step S4, forming a plurality of color resists in the plurality of openings on the OLED display panel.

In the step S4, the plurality of color resists are formed in the plurality of openings on the second insulating layer; or in the step S2, forming a plurality of first holes on the second insulating layer so that the plurality of first holes are correspondingly located above the plurality of sub-pixels after forming the second insulating layer; the plurality of openings are disposed on the plurality of first holes, respectively; and in the step S4, the plurality of color resists are formed in the plurality of first holes on the first insulating layer; or in the step S2, forming a plurality of second holes on the second insulating layer and the first insulating layer so that the plurality of second holes are correspondingly located above the plurality of sub-pixels after forming the second insulating layer; the plurality of openings are disposed on the plurality of second holes, respectively; and in the step S4, the plurality of color resists are formed in the plurality of second holes on the OLED display panel.

The method of manufacturing an OLED display device further comprises step S5 of forming a protective layer on the hard mask and the plurality of color resists.

The hard mask is made of silicon nitride, the first metal layer is transparent and has a structure comprising an aluminum layer sandwiched between two titanium layers, the second metal layer is transparent and has a structure comprising an aluminum layer sandwiched between two titanium layers, each of the first insulating layer and the second insulating layer is made of silicon nitride, and in the step S2, a via hole is formed on the second insulating layer and located on the first metal layer after forming the second insulating layer, wherein the second metal layer and is in contact with the first metal layer through the via hole.

The step S3 comprises step S31, forming the metal material layer, the black matrix material layer, the hard mask material layer, and a photoresist layer in turn on the second insulating layer; step S32, performing an exposure and development process on the photoresist layer to form a plurality of third holes above the plurality of sub-pixels, respectively; step S33, patterning, by the photoresist layer functioning as a mask, the metal material layer, the black matrix material layer, and the hard mask material layer to form the second metal layer, the black matrix, and the hard mask in turn on the second insulating layer; and step S34, stripping the photoresist layer.

In the step S4, the plurality of color resists are formed in the plurality of openings on the OLED display panel by coating or inkjet printing.

The present invention has advantageous effects as follows: an OLED display device of the present invention includes an OLED display panel, a first insulating layer disposed on the OLED display panel, a first metal layer disposed on the first insulating layer, a second insulating layer disposed on the first metal layer and the first insulating layer, a second metal layer disposed on the second insulating layer, a black matrix disposed on the second metal layer, a hard mask disposed on the black matrix, and a plurality of color resists disposed on the OLED display panel, wherein the OLED display panel includes a plurality of sub-pixels, and a plurality of openings extending through the second metal layer, the black matrix, and the hard mask and positioned corresponding to the plurality of sub-pixels, and wherein the plurality of color resists are disposed in the plurality of openings, respectively. In this manner, the present invention can effectively eliminate reflective light of the OLED display device under strong light, reduce number of masks in need for a manufacturing process, and reduce product cost. An OLED display device manufactured by the method of the present invention can reduce light reflectance and be manufactured at a lower cost.

BRIEF DESCRIPTION OF DRAWINGS

In order to further understand the features and technical contents of the present invention, please refer to the following detailed description of the invention and the accompanying drawings. However, the accompanying drawings are provided for reference and description of the invention only and are not intended to limit the invention.

DESCRIPTION OF PREFERRED EMBODIMENTS

Figure 1:
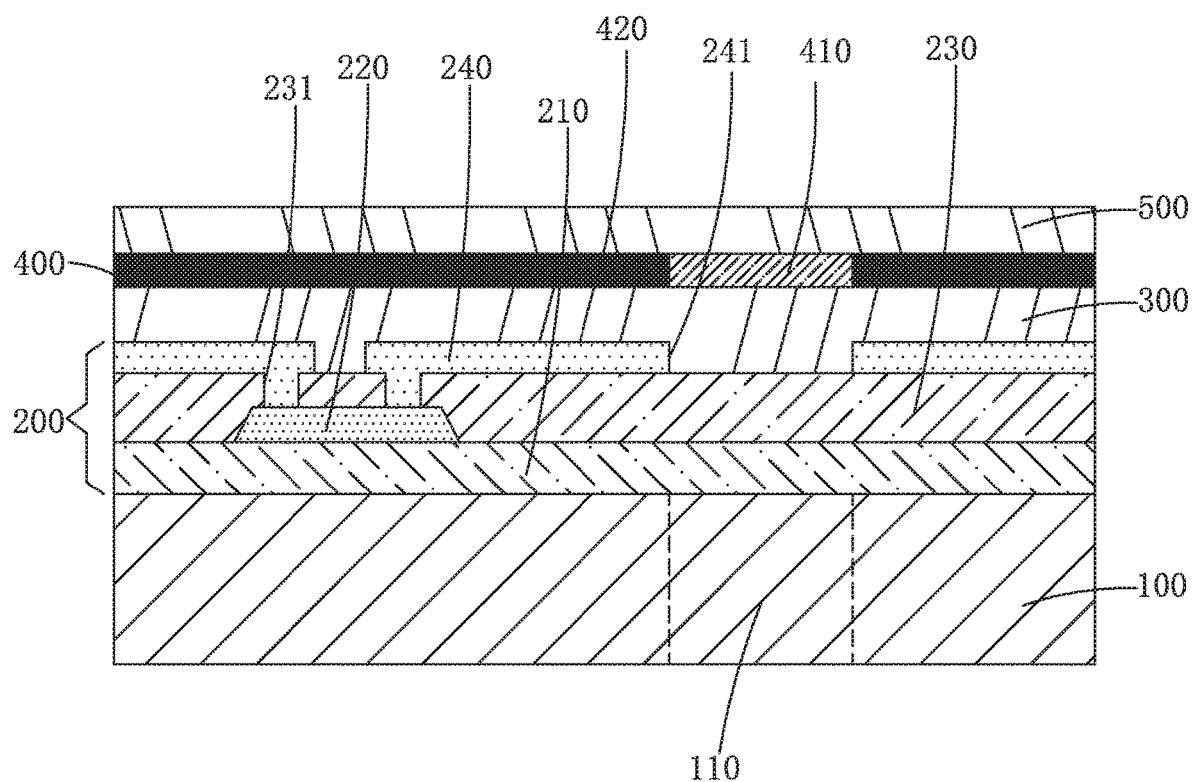
FIG. 1 is a schematic structural view of a conventional organic light emitting diode (OLED) display device.

In order to further clarify the technical solutions and effects of the present invention, the following detailed description will be made in conjunction with the preferred embodiments of the invention and the accompanying drawings Please refer to FIG. 2. A first embodiment of the present invention provides an organic light emitting diode (OLED) display device including an OLED display panel 10, a first insulating layer 20 disposed on the OLED display panel 10, a first metal layer 30 disposed on the first insulating layer 20, a second insulating layer 40 disposed on the first metal layer 30 and the first insulating layer 20, a second metal layer 50 disposed on the second insulating layer 40, a black matrix 60 disposed on the second metal layer 50, a hard mask 70 disposed on the black matrix 60, and a plurality of color resists 80 disposed on the OLED display panel 10. One side of the first insulating layer 20 is provided to be a light emitting side for the OLED display panel 10, and the first insulating layer 20, the first metal layer 30, the second insulating layer 40, and the second metal layer 50 cooperatively form a touch layer on the OLED display panel 10. The OLED display panel 10 includes a plurality of sub-pixels 11. A plurality of openings 51 extend through the second metal layer 50, the black matrix 60, and the hard mask 70 and are positioned corresponding to the plurality of sub-pixels 11, wherein the plurality of color resists 80 are disposed in the plurality of openings 51, respectively.

Specifically, the plurality of sub-pixels 11 include red sub-pixels, green sub-pixels, and blue sub-pixels. The color resists 80 located above the red sub-pixels are red color resists, the color resists 80 located above the green sub-pixels are green color resists, and the color resists 80 located above the blue sub-pixels are blue color resists.

Figure 2:
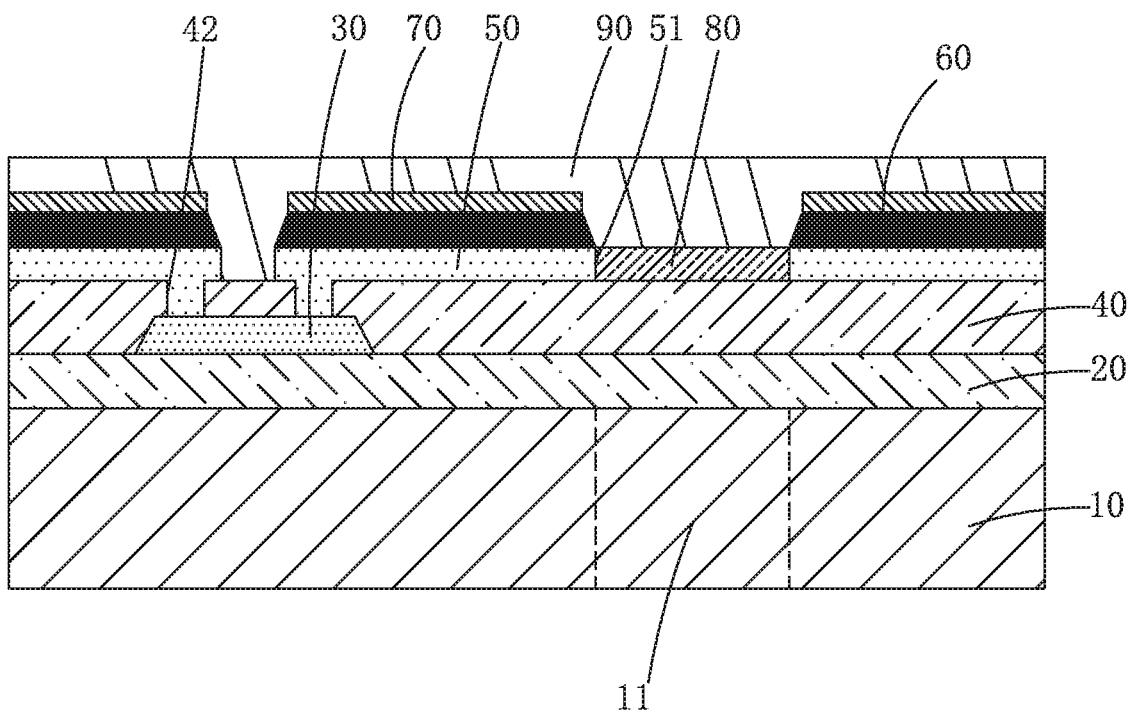
FIG. 2 is a schematic structural view of a first embodiment of an OLED display device of the present invention.

Please refer to FIG. 2. Specifically, in the first embodiment of the present invention, the first insulating layer 20 and the second insulating layer 40 each cover a plurality of sub-pixels 11, and the plurality of color resists 80 are disposed on the second insulating layer 40.

Specifically, the OLED display device further includes a protective film 90 disposed on the hard mask 70 and the plurality of color resists 80.

Specifically, the hard mask 70 is made of silicon nitride (SiNx).

Specifically, the first metal layer 30 is transparent and has a structure including an aluminum (Al) layer sandwiched between two titanium (Ti) layers, or a structure having low impedance and high transparency.

Specifically, the second metal layer 50 is transparent and has a structure including an aluminum layer sandwiched between two titanium layers, or a structure having low impedance and high transparency.

Specifically, each of the first insulating layer 20 and second insulating layer 40 is made of silicon nitride.

The second insulating layer 40 is configured with a via hole 42 disposed on the first metal layer 30, wherein the second metal layer 50 is in connection with the first metal layer 30 through the via hole 42.

Particularly, the OLED display device of the present invention utilizes the plurality of openings 51 extending through the second metal layer 50, the black matrix 60, and the hard mask 70 of the touch layer and disposed corresponding to the plurality of sub-pixels 11, and the plurality of color resists 80 each located in the plurality of openings 51 to effectively eliminate reflective light of the OLED display device under strong light. The black matrix 60 can be manufactured by using a same mask as the second metal layer 50, so that number of masks required for manufacturing the OLED display device can be reduced to effectively lower cost and process time of a product. Furthermore, the black matrix 60 can shield the second metal layer 50 to prevent light from reflecting on the second metal layer 50 and thus avoid adverse effects of display quality. After the hard mask 70 is patterned to form the second metal layer 50 and the black matrix 60, the hard mask 70 is also configured to prevent a stripping process of stripping a photoresist layer on the black matrix 60 from causing damage to the black matrix 60, thereby to ensure the quality of the product.

Figure 3:
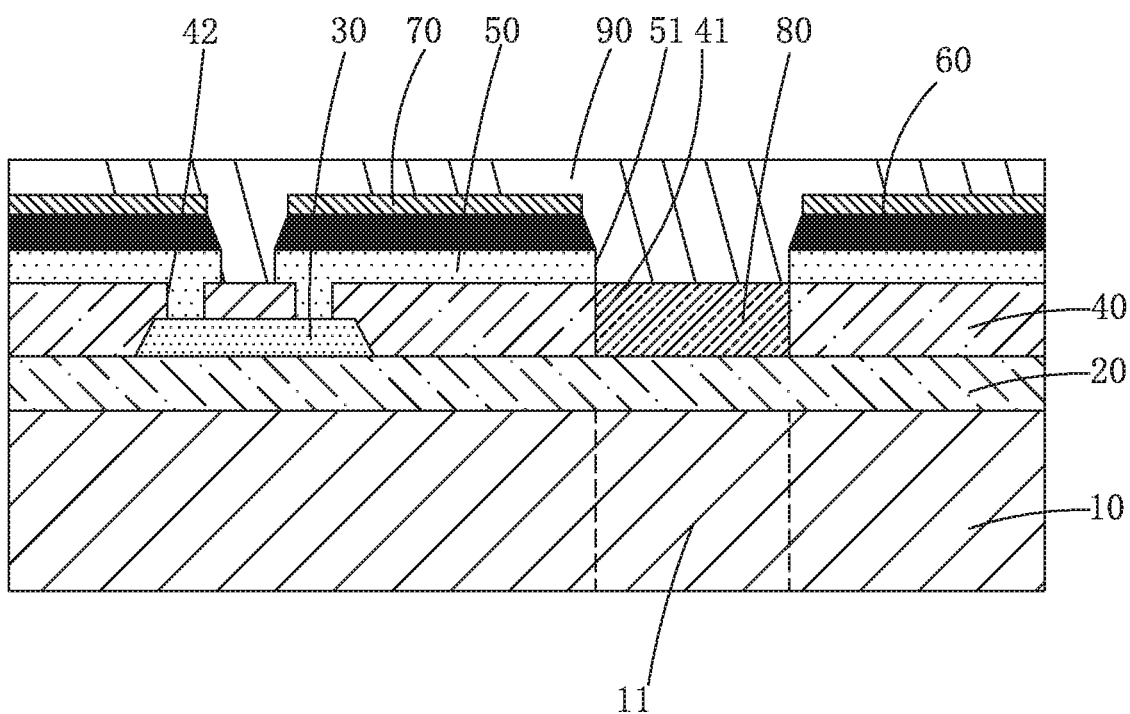
FIG. 3 is a schematic structural view of a second embodiment of an OLED display device of the present invention.

Please refer to FIG. 3. An OLED display device of a second embodiment of the present invention is different from the above-mentioned first embodiment in that the second insulating layer 40 is configured with a plurality of first holes 41 disposed above the plurality of sub-pixels 11, and the plurality of openings 51 are disposed above the plurality of first holes 41. The plurality of color resists 80 are disposed on the first insulating layer 20 and located in the plurality of first holes 41, respectively. Other structures of the second embodiment are the same as the first embodiment and are not reiterated herein. Compared with the first embodiment, a distance between the plurality of color resists 80 and the OLED display panel 10 of the second embodiment is greatly reduced, thereby to enhance transmittance of the OLED display device and to improve product quality.

Figure 4:
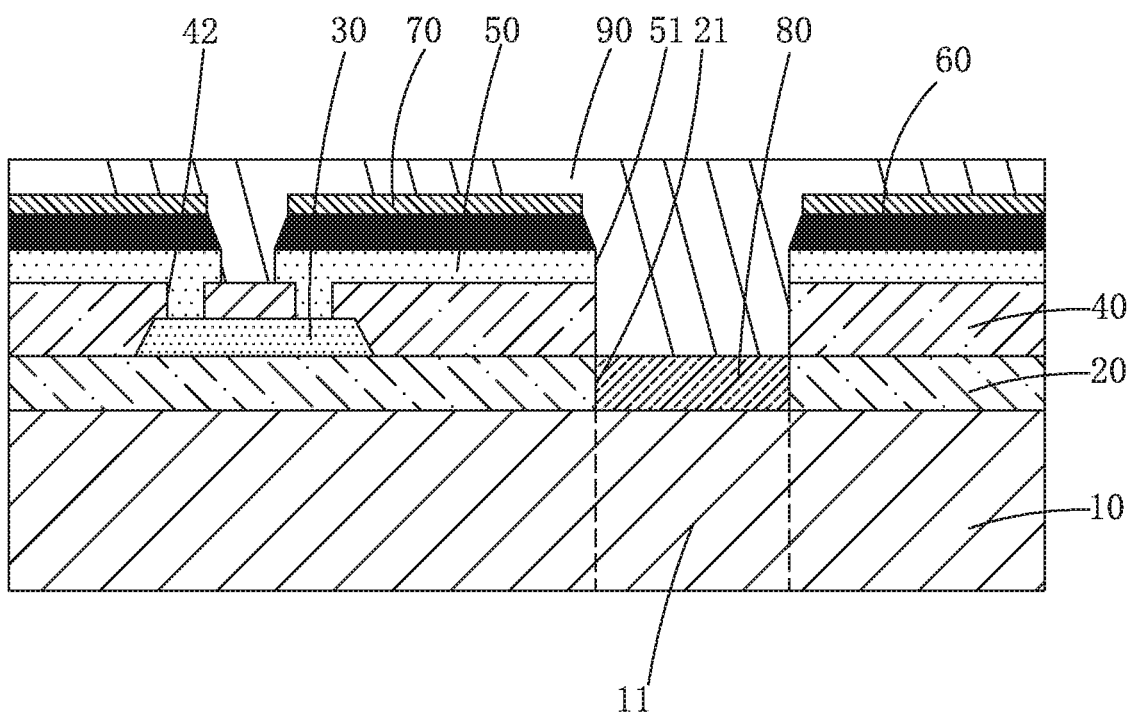
FIG. 4 is a schematic structural view of a third embodiment of an OLED display device of the present invention.

Please refer to FIG. 4. An OLED display device of a third embodiment of the present invention is different from the above-mentioned first embodiment in that each of the second insulating layer 40 and the first insulating layer 20 is configured with a plurality of second holes 21 disposed on the plurality of sub-pixels 11, and a plurality of openings 51 are disposed above the second holes 21. The plurality of color resists 80 are disposed on the OLED display panel 10 and located in the plurality of second holes 21, respectively. Other structures of the third embodiment are the same as the first embodiment and are not reiterated herein. Compared with the first and the second embodiments, a distance between the plurality of color resists 80 and the OLED display panel 10 of the third embodiment is greatly reduced, thereby to enhance transmittance of the OLED display device and to improve product quality.

Figure 5:
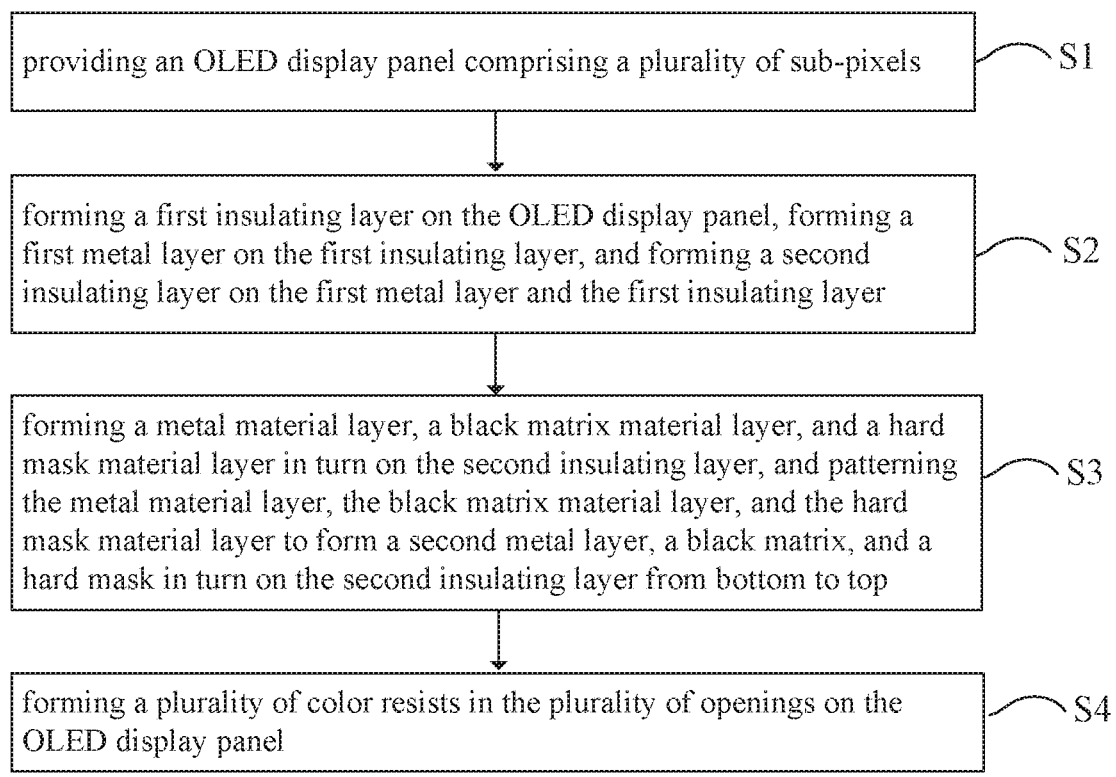
FIG. 5 is a flowchart showing a method of manufacturing an OLED display device of the present invention.
Figure 6:
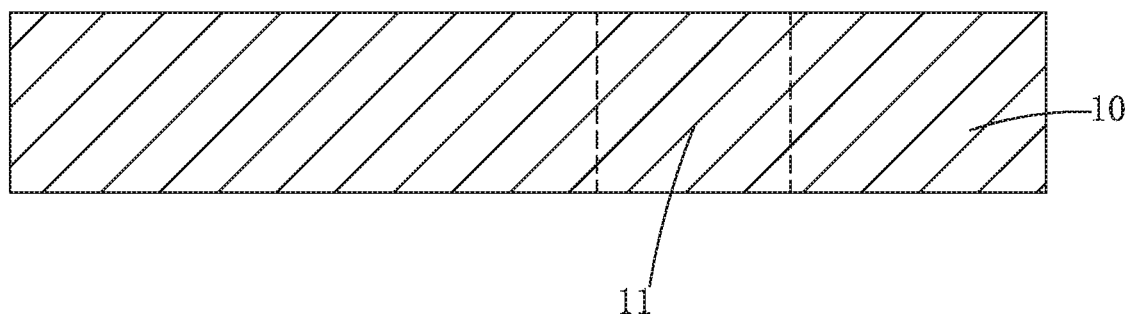
FIG. 6 is a schematic view showing a step S1 of a method of manufacturing an OLED display device of the present invention.

Please refer to FIG. 5. Based on the same inventive concept, a method of manufacturing an OLED display device according to the first embodiment of the present invention includes the following steps:

Please refer to FIG. 6 showing step S1: providing an OLED display panel 10 including a plurality of sub-pixels 11.

Specifically, the plurality of sub-pixels 11 include red sub-pixels, green sub-pixels, and blue sub-pixels.

Figure 7:
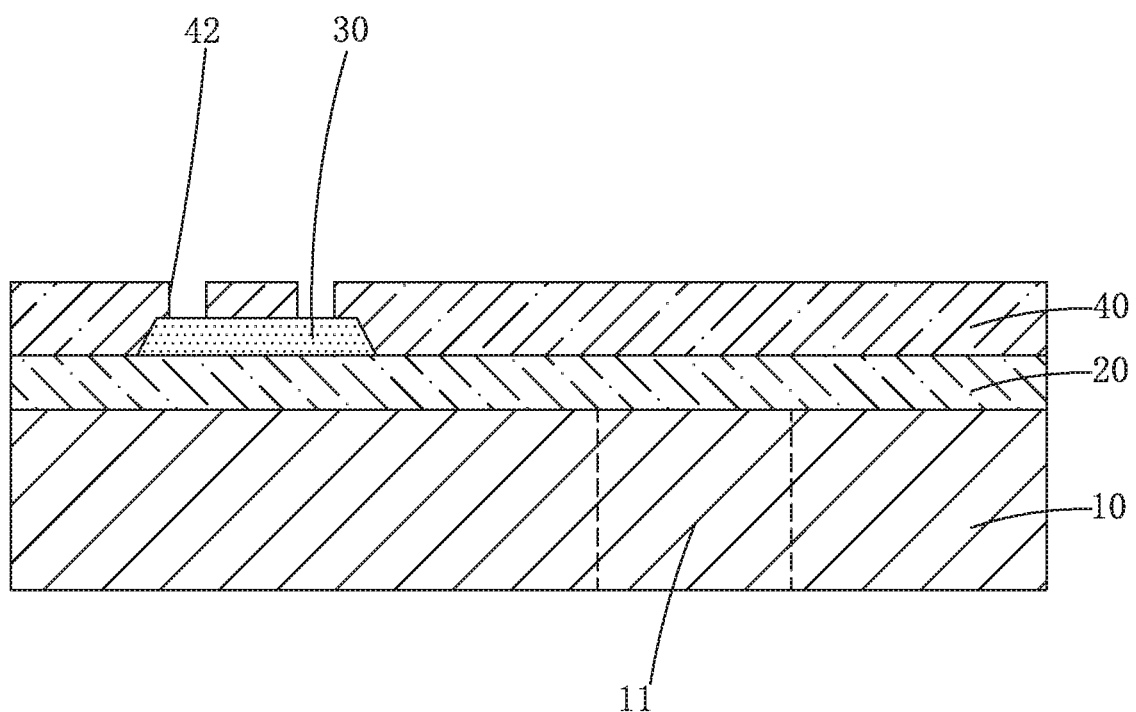
FIG. 7 is a schematic view showing a step S2 of a method of manufacturing an OLED display device of a first embodiment of the present invention.

Please refer to FIG. 7 showing step S2: forming a first insulating layer 20 on the OLED display panel 10, forming a first metal layer 30 on the first insulating layer 20, and forming a second insulating layer 40 on the first metal layer 30 and the first insulating layer 20.

Specifically, the first metal layer 30 is transparent and has a structure including an aluminum (Al) layer sandwiched between two titanium (Ti) layers, or a structure having low impedance and high transparency.

Specifically, each of the first insulating layer 20 and the second insulating layer 40 is made of silicon nitride.

Specifically, in the step S2, a via hole 42 is formed on the second insulating layer 40 and is located on the first metal layer 30 after forming the second insulating layer 40.

Figure 8:
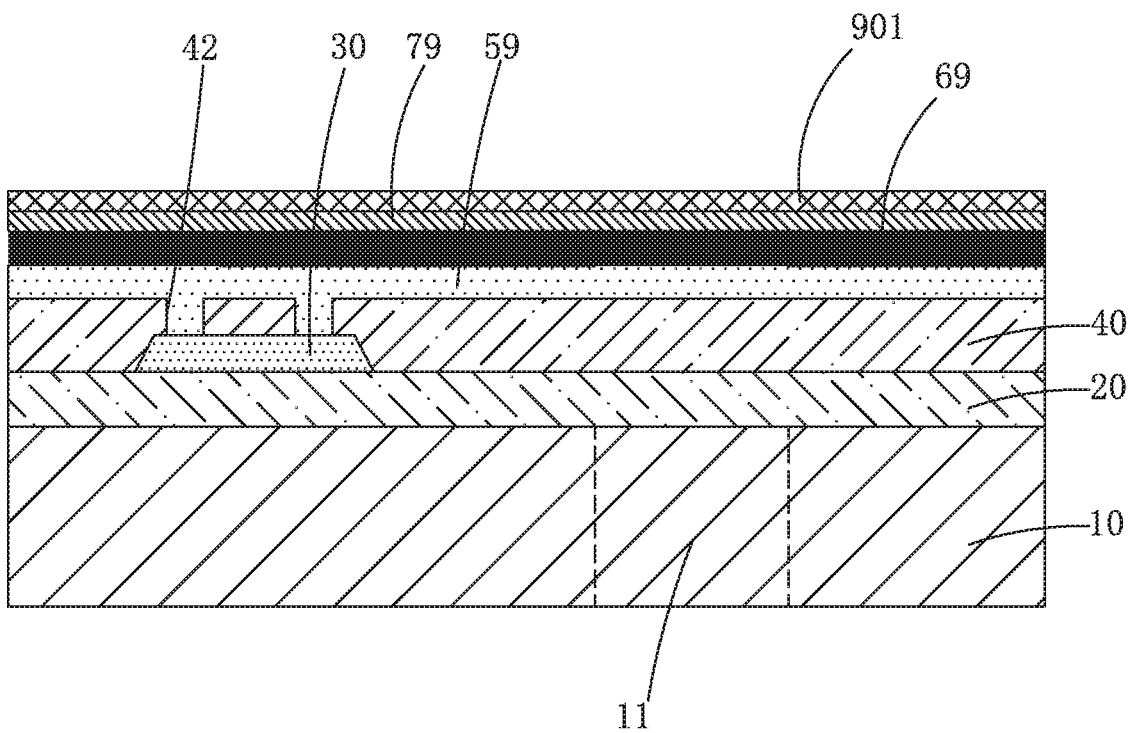
FIGS. 8-11 are schematic views showing a step S3 of the method of manufacturing the OLED display device of the first embodiment of the present invention.
Figure 11:
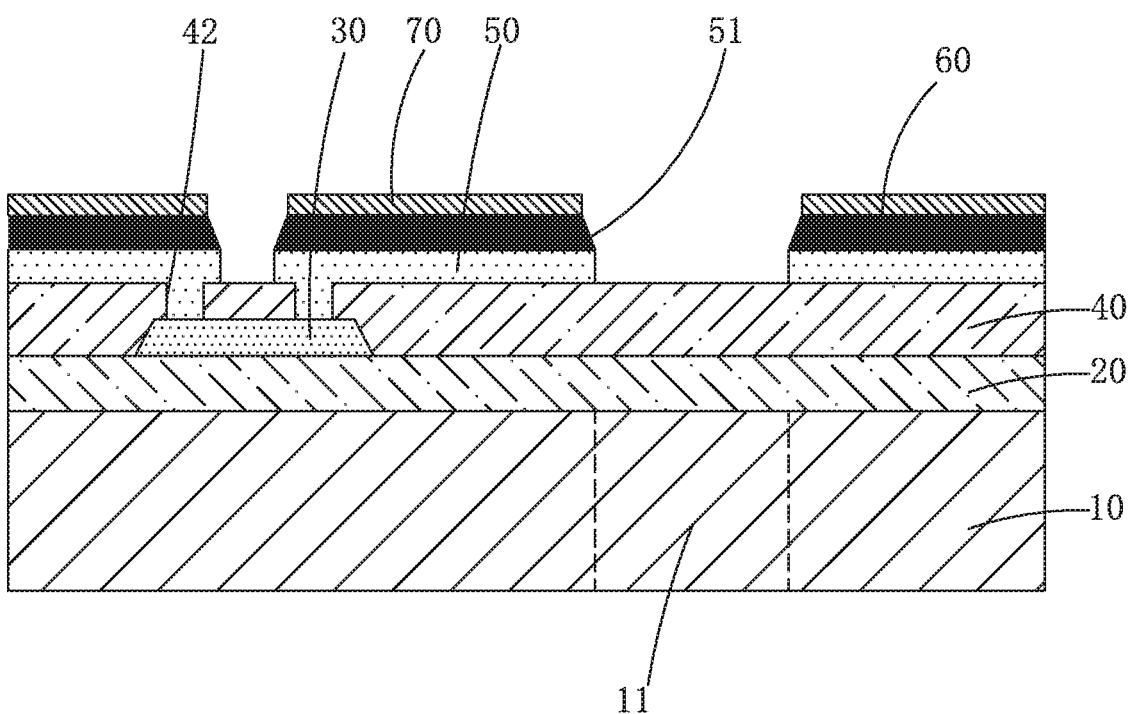

Please refer to FIGS. 8 and 11 showing step S3: forming a metal material layer 59, a black matrix material layer 69, and a hard mask material layer 79 in turn on the second insulating layer 40, and patterning the metal material layer 59, the black matrix material layer 69, and the hard mask material layer 79 to form a second metal layer 50, a black matrix 60, and a hard mask 70 in turn on the second insulating layer 40 from bottom to top. A plurality of openings 51 are formed to extend through the second metal layer 50, the black matrix 60, and the hard mask 70, and are disposed corresponding to the plurality of sub-pixels 11.

Specifically, the metal material layer 59 is transparent and has a structure including an aluminum layer sandwiched between two titanium layers, or a structure having low impedance and high transparency.

Specifically, the hard mask material layer 79 is made of silicon nitride.

Specifically, the second metal layer 50 is in connection with the first metal layer 30 through the via hole 42.

Specifically, step S3 includes following steps.

Please refer to FIG. 8 showing step S31: forming the metal material layer 59, the black matrix material layer 69, the hard mask material layer 79, and a photoresist layer 901 in turn on the second insulating layer 40.

Figure 9:
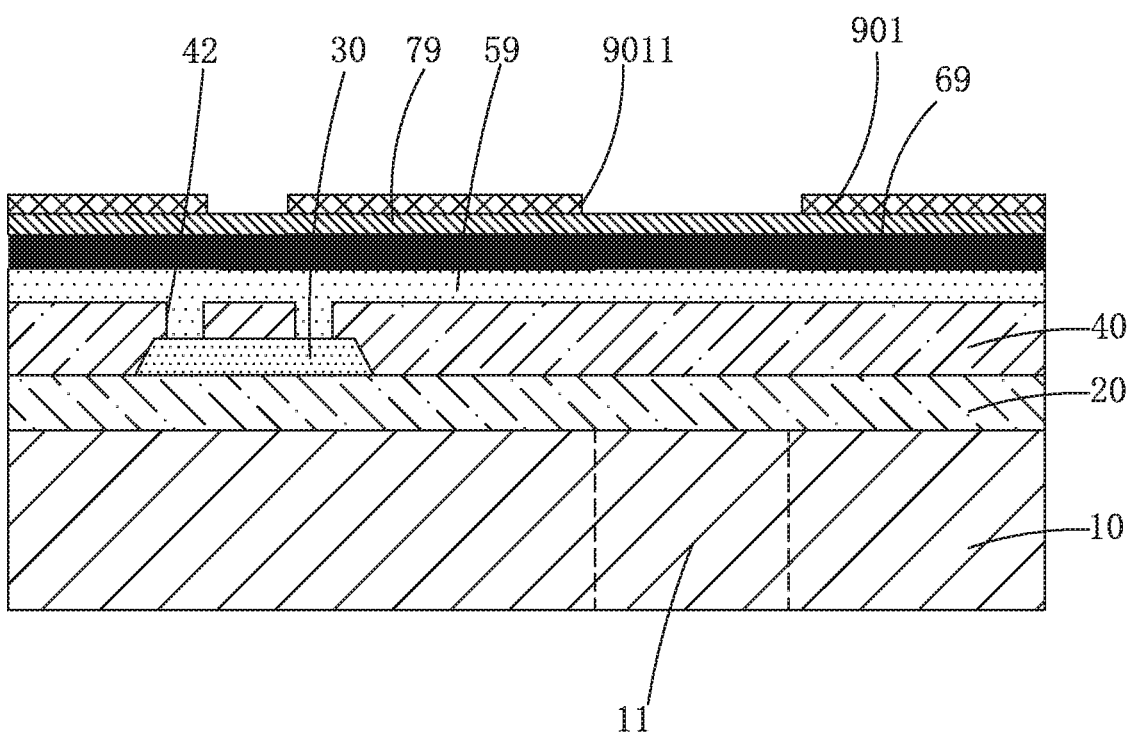
Figure 10:
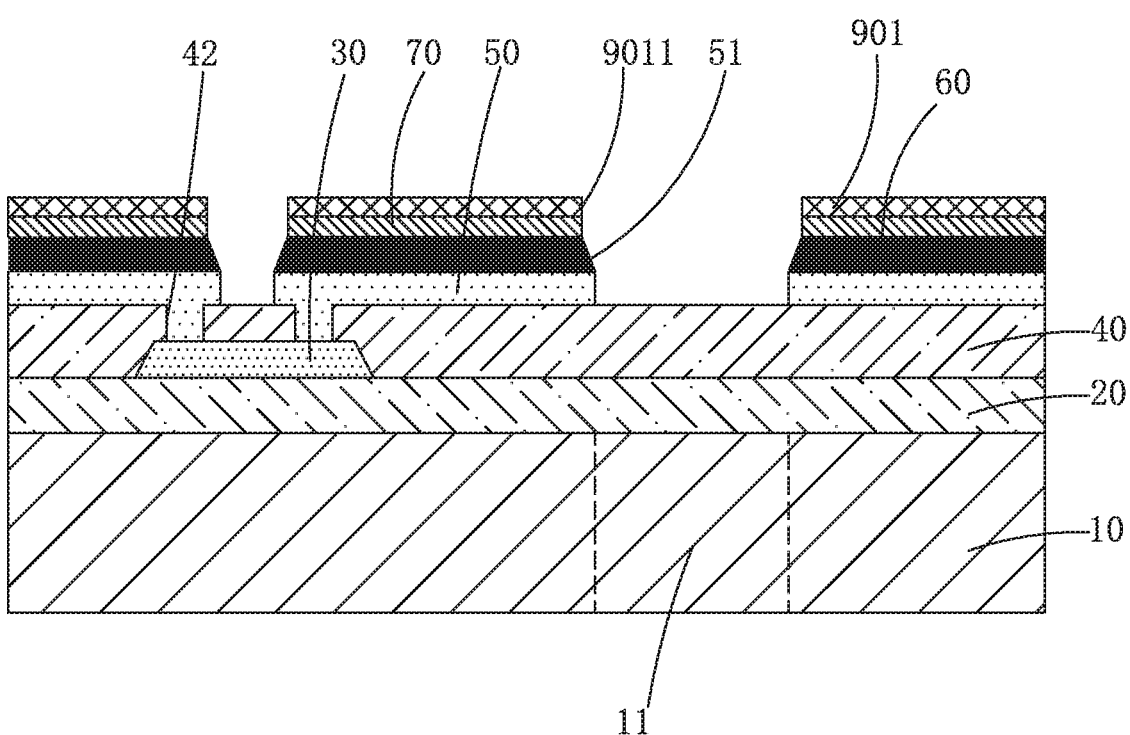

Please refer to FIG. 9 showing step S32: performing an exposure and development process on the photoresist layer 901 to form a plurality of third holes 9011 above the plurality of sub-pixels 11, respectively;

Please refer to FIG. 10 showing Step S33: patterning, by the photoresist layer 901 functioning as a mask, the metal material layer 59, the black matrix material layer 69, and the hard mask material layer 79 to form the second metal layer 50, the black matrix 60, and the hard mask 70 in turn on the second insulating layer 40.

Please refer to FIG. 11 showing step S34: stripping the photoresist layer 901

Figure 12:
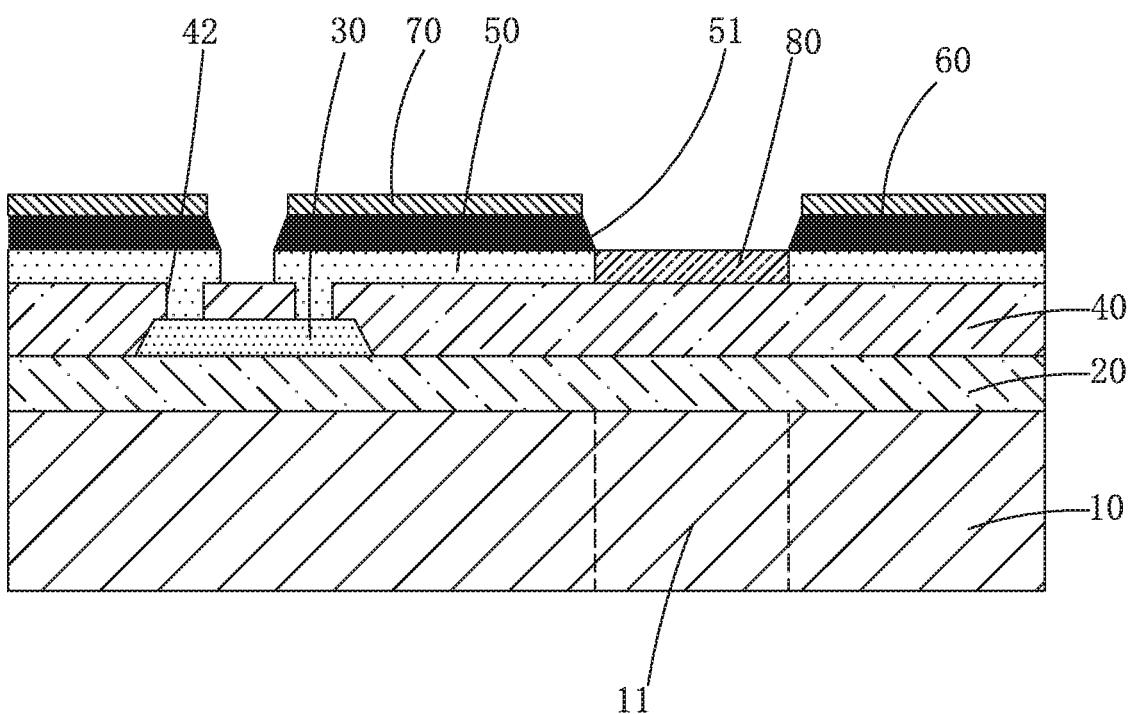
FIG. 12 is a schematic view showing a step S4 of the method of manufacturing the OLED display device of the first embodiment of the present invention.

Please refer to FIG. 12 showing step S4: forming a plurality of color resists 80 in the plurality of openings 51 on the OLED display panel 10.

Specifically, in the step S4, the plurality of color resists 80 are formed in the plurality of openings 51 on the second insulating layer 40.

Specifically, in the step S4, the plurality of color resists 80 are formed in the plurality of openings 51 on the OLED display panel 10 by coating or inkjet printing.

Please refer to FIG. 12 in combination with FIG. 2 showing step S5: forming a protective layer 90 on the hard mask 70 and the plurality of color resists 80. In the method of manufacturing the OLED display device of the first embodiment of the present invention, the metal material layer 59, the black matrix material layer 69, and the hard mask material layer 79 formed on the second insulating layer 40 are patterned by the same mask to form the second metal layer 50, the black matrix 60, and the hard mask 70 in turn on the second insulating layer 40 from bottom to top. The plurality of openings 51 are formed to extend through the second metal layer 50, the black matrix 60, and the hard mask 70, and are disposed corresponding to the plurality of sub-pixels 11. The plurality of color resists 80 are formed in the plurality of openings 51 on the OLED display panel 10. In this manner, the OLED display device manufactured by the method can reduce light reflectance, improve display quality, and reduce number of masks in need in comparison with conventional technology, thereby to effectively lower cost and process time of a product. Furthermore, the black matrix 60 can shield the second metal layer 50 to prevent light from reflecting on the second metal layer 50 and thus avoid adverse effects of display quality. After the hard mask 70 is patterned to form the second metal layer 50 and the black matrix 60, the hard mask 70 is also configured to prevent a stripping process of stripping a photoresist layer on the black matrix 60 from causing damage to the black matrix 60, thereby to ensure the quality of the product.

Figure 13:
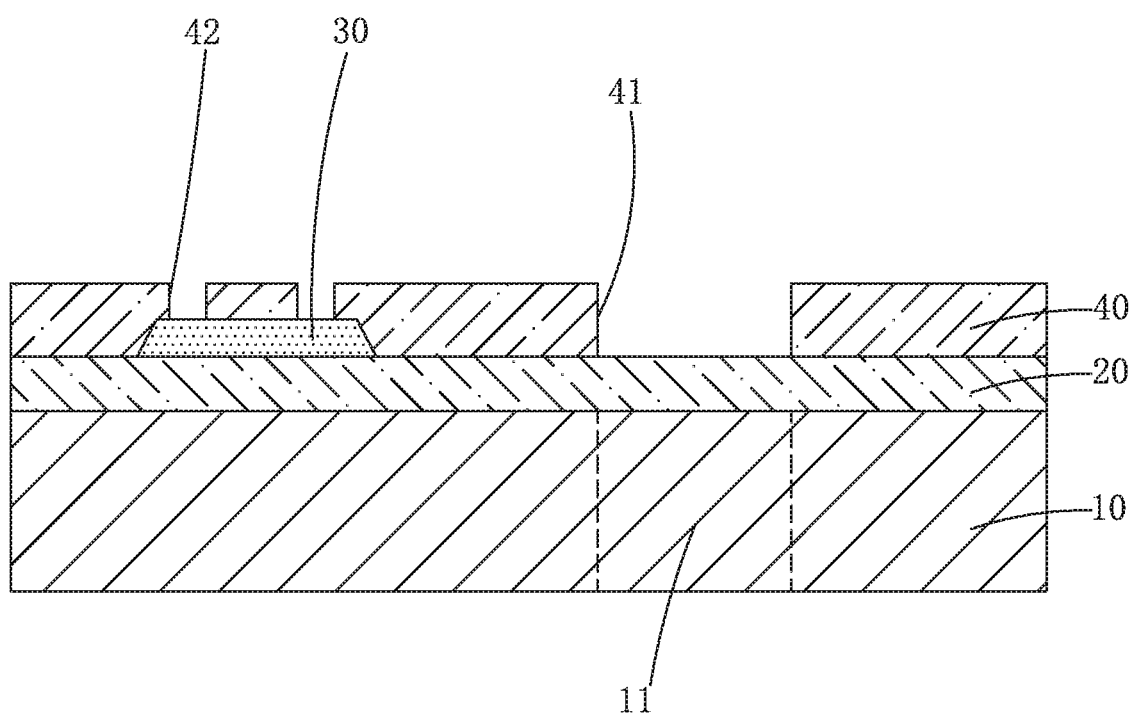
FIG. 13 is a schematic view showing a step S2 of a method of manufacturing an OLED display device of a second embodiment of the present invention.

Please refer to FIG. 13. A method of manufacturing an OLED display device of a second embodiment of the present invention is different from the above-mentioned first embodiment in that after forming the second insulating layer 40 in the step S2, a plurality of first holes 41 are formed on the second insulating layer 40 and located above the plurality of sub-pixels 11. After step S3 is completed, a plurality of openings 51 are disposed above the plurality of first holes 41. Please refer to FIG. 13 in combination with FIG. 3. In the step S4, the plurality of color resists 80 are formed on the first insulating layer 20 and located in the plurality of first holes 41, respectively. Other structures of the second embodiment are the same as the first embodiment and are not reiterated herein. Compared with the first embodiment, a distance between the plurality of color resists 80 of an OLED display device manufactured by the second embodiment of the present invention and the OLED display panel 10 is greatly reduced, thereby enhancing transmittance of the OLED display device and improving product quality.

Figure 14:
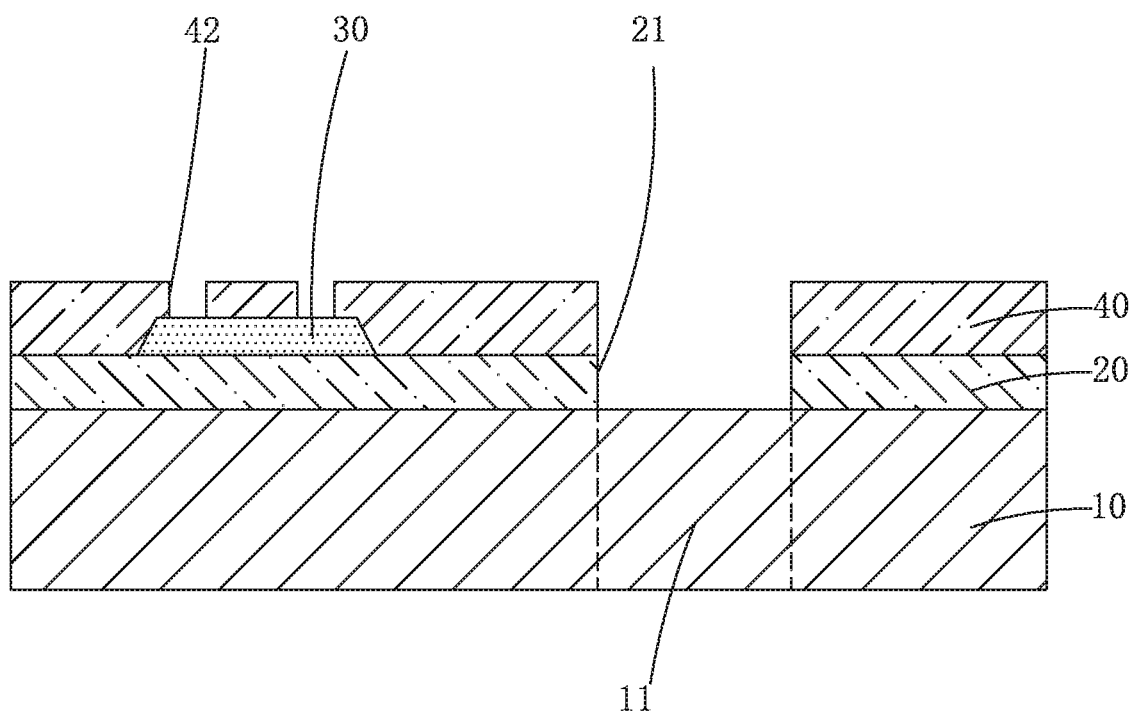
FIG. 14 is a schematic view showing a step S2 of a method of manufacturing an OLED display device of a third embodiment of the present invention.

Please refer to FIG. 14. A method of manufacturing an OLED display device of a third embodiment of the present invention is different from the above-mentioned first embodiment in that after forming the second insulating layer 40 in the step S2, a plurality of second holes 21 are formed on both the second insulating layer 40 and the first insulating layer 20 and disposed on the plurality of sub-pixels 11. After step S3 is completed, a plurality of openings 51 are formed above the second holes 21. Further referring to FIG. 4, in the step S4, a plurality of color resists 80 are formed on the OLED display panel 10 and located in the plurality of second holes 21, respectively. Other structures of the third embodiment are the same as the first embodiment and are not reiterated herein. Compared with the first and the second embodiments, a distance between the plurality of color resists 80 of an OLED display device manufactured by the third embodiment and the OLED display panel 10 is greatly reduced, thereby enhancing transmittance of the OLED display device and improving product quality.

In summary, an OLED display device of the present invention includes an OLED display panel, a first insulating layer disposed on the OLED display panel, a first metal layer disposed on the first insulating layer, a second insulating layer disposed on the first metal layer and the first insulating layer, a second metal layer disposed on the second insulating layer, a black matrix disposed on the second metal layer, a hard mask disposed on the black matrix, and a plurality of color resists disposed on the OLED display panel, wherein the OLED display panel includes a plurality of sub-pixels, and a plurality of openings extending through the second metal layer, the black matrix, and the hard mask and positioned corresponding to the plurality of sub-pixels, and wherein the plurality of color resists are disposed in the plurality of openings, respectively. In this manner, the present invention can effectively eliminate reflective light of the OLED display device under strong light, reduce number of masks in need for a manufacturing process, and reduce product cost. An OLED display device manufactured by the method of the present invention can reduce light reflectance and be manufactured at a lower cost.

Accordingly, those skilled in the art may make various changes or modifications from the technical solutions and ideas of the present invention, and thus the scope of the present invention should be after the appended claims and their equivalents.

What is claimed is:

1. An organic light emitting diode (OLED) display device, comprising:
   an OLED display panel, a first insulating layer disposed on the OLED display panel, a first metal layer disposed on the first insulating layer, a second insulating layer disposed on the first metal layer and the first insulating layer, a second metal layer disposed on the second insulating layer, a black matrix disposed on the second metal layer, a hard mask disposed on the black matrix, and a plurality of color resists disposed on the OLED display panel;
   wherein the OLED display panel comprises a plurality of sub-pixels, and a plurality of openings extending through the second metal layer, the black matrix, and the hard mask and positioned corresponding to the plurality of sub-pixels, and wherein the plurality of color resists are disposed in the plurality of openings, respectively, wherein a photoresist layer is removably disposed over the hard mask and allows for patterning of the second metal layer, the black matrix, and the hard mask, and formation of the openings on the second insulating layer.

2. The OLED display device of claim 1, wherein the plurality of color resists are disposed on the second insulating layer;
   or the second insulating layer is configured with a plurality of first holes disposed above the plurality of sub-pixels, the plurality of openings are disposed above the plurality of first holes, and the plurality of color resists are disposed on the first insulating layer and located in the plurality of first holes, respectively;
   or each of the second insulating layer and the first insulating layer is configured with a plurality of second holes disposed on the plurality of sub-pixels, the plurality of openings are disposed above the second holes, and the plurality of color resists are disposed on the OLED display panel and located in the plurality of second holes, respectively.

3. The OLED display device of claim 1, further comprising a protective film disposed on the hard mask and the plurality of color resists.

4. The OLED display device of claim 1, wherein a material of the hard mask is silicon nitride, the first metal layer is transparent and has a structure comprising an aluminum layer sandwiched between two titanium layers, the second metal layer is transparent and has a structure comprising an aluminum layer sandwiched between two titanium layers, a material of each of the first insulating layer and the second insulating layer is silicon nitride, and the second insulating layer is configured with a via hole disposed on the first metal layer, wherein the second metal layer is in connection with the first metal layer through the via hole.

5. A method of manufacturing an organic light emitting diode (OLED) display device, comprising:
   step S1, providing an OLED display panel comprising a plurality of sub-pixels;
   step S2, forming a first insulating layer on the OLED display panel, forming a first metal layer on the first insulating layer, and forming a second insulating layer on the first metal layer and the first insulating layer;
   step S3, forming a metal material layer, a black matrix material layer, and a hard mask material layer in turn on the second insulating layer, and patterning the metal material layer, the black matrix material layer, and the hard mask material layer to form a second metal layer, a black matrix, and a hard mask in turn on the second insulating layer from bottom to top, wherein a plurality of openings are formed to extend through the second metal layer, the black matrix, and the hard mask and are disposed corresponding to the plurality of sub-pixels; and
   step S4, forming a plurality of color resists in the plurality of openings on the OLED display panel;
   wherein the step S3 comprises step S31, forming the metal material layer, the black matrix material layer, the hard mask material layer, and a photoresist layer in turn on the second insulating layer; step S32, performing an exposure and development process on the photoresist layer to form a plurality of third holes above the plurality of sub-pixels, respectively; step S33, patterning, by the photoresist layer functioning as a mask, the metal material layer, the black matrix material layer, and the hard mask material layer to form the second metal layer, the black matrix, and the hard mask in turn on the second insulating layer; and step S34, stripping the photoresist layer.

6. The method of manufacturing the OLED display device of claim 5, wherein in the step S4, the plurality of color resists are formed in the plurality of openings on the second insulating layer;
   or in the step S2, forming a plurality of first holes on the second insulating layer so that the plurality of first holes are correspondingly located above the plurality of sub-pixels after forming the second insulating layer; the plurality of openings are disposed on the plurality of first holes, respectively; and in the step S4, the plurality of color resists are formed in the plurality of first holes on the first insulating layer;
   or in the step S2, forming a plurality of second holes on the second insulating layer and the first insulating layer so that the plurality of second holes are correspondingly located above the plurality of sub-pixels after forming the second insulating layer; the plurality of openings are disposed on the plurality of second holes, respectively; and in the step S4, the plurality of color resists are formed in the plurality of second holes on the OLED display panel.

7. The method of manufacturing the OLED display device of claim 5, further comprising step S5 of forming a protective layer on the hard mask and the plurality of color resists.

8. The method of manufacturing the OLED display device of claim 5, wherein the hard mask is made of silicon nitride, the first metal layer is transparent and has a structure comprising an aluminum layer sandwiched between two titanium layers, the second metal layer is transparent and has a structure comprising an aluminum layer sandwiched between two titanium layers, each of the first insulating layer and the second insulating layer is made of silicon nitride, and in the step S2, a via hole is formed on the second insulating layer and located on the first metal layer after forming the second insulating layer, wherein the second metal layer and is in contact with the first metal layer through the via hole.

9. The method of manufacturing the OLED display device of claim 5, wherein in the step S4, forming, by coating or inkjet printing, the plurality of color resists in the plurality of openings on the OLED display panel.

* * * * *

UNITED STATES PATENT AND TRADEMARK OFFICE
CERTIFICATE OF CORRECTION

PATENT NO. : 10,879,498 B2
APPLICATION NO. : 16/492162
DATED : December 29, 2020
INVENTOR(S) : Lei Wang et al.

Page 1 of 1

It is certified that error appears in the above-identified patent and that said Letters Patent is hereby corrected as shown below:

On the Title Page

Item (30) Foreign Application Priority Data should read:
"February 27, 2019 (CN) 201910147724.1"

Signed and Sealed this
Sixth Day of April, 2021

Drew Hirshfeld
*Performing the Functions and Duties of the
Under Secretary of Commerce for Intellectual Property and
Director of the United States Patent and Trademark Office*